(12) United States Patent  
Chen et al.

(10) Patent No.: US 8,581,638 B2
(45) Date of Patent: Nov. 12, 2013

(54) HIGH-SIDE DRIVER CIRCUIT

(75) Inventors: Tsung-Lin Chen, Taipei (TW); Edward Yi Chang, Hsinchu (TW); Wei-Hua Chieng, Hsinchu (TW); Stone Cheng, Hsinchu (TW); Shyr-Long Jeng, Hsinchu (TW); Che-Wei Chang, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/596,113

(22) Filed: Aug. 28, 2012

(65) Prior Publication Data

US 2013/0241601 A1  Sep. 19, 2013

(30) Foreign Application Priority Data

Mar. 15, 2012 (TW) .............................. 101108777 A

(51) Int. Cl.
*H03B 1/00* (2006.01)
(52) U.S. Cl.
USPC ............................. 327/108; 327/427; 327/437
(58) Field of Classification Search
None
See application file for complete search history.

(56) References Cited

U.S. PATENT DOCUMENTS

| 5,977,814 | A | * | 11/1999 | Ishii | 327/434 |
| 6,060,948 | A | * | 5/2000 | Tarantola et al. | 327/589 |
| RE40,844 | E | * | 7/2009 | Yang | 327/390 |
| 2004/0227471 | A1 | * | 11/2004 | Ribarich | 315/291 |
| 2006/0273774 | A1 | * | 12/2006 | Galinski | 323/288 |
| 2008/0018364 | A1 | * | 1/2008 | Clarkin et al. | 327/110 |
| 2008/0106319 | A1 | * | 5/2008 | Bayerer | 327/432 |
| 2008/0129372 | A1 | * | 6/2008 | Rozsypal et al. | 327/536 |
| 2008/0180083 | A1 | * | 7/2008 | Briere et al. | 323/371 |
| 2009/0066400 | A1 | * | 3/2009 | Fischer et al. | 327/375 |
| 2012/0133397 | A1 | * | 5/2012 | Draxelmayr et al. | 327/81 |
| 2012/0293219 | A1 | * | 11/2012 | Bai et al. | 327/109 |
| 2013/0200869 | A1 | * | 8/2013 | Sasao et al. | 323/282 |

* cited by examiner

*Primary Examiner* — Tuan T Lam
(74) *Attorney, Agent, or Firm* — Bacon & Thomas, PLLC

(57) ABSTRACT

The present invention provides a high-side driver circuit including a power transistor, the first transistor, the second transistor, the second capacitor, the second diode, a start-up circuit. The start-up circuit is coupled between a resistor and the second capacitor to complete a gate driving circuit. And, the aforementioned resistor can either be the gate resistance of the power transistor or an external resistor. The design of start-up circuit enables the functionality of the bootstrap capacitor of being charged to a designate voltage level. Thus, the depletion-mode transistor can be controlled to turn on/off without a floating voltage source or a negative voltage source.

6 Claims, 3 Drawing Sheets

200

HIGH-SIDE DRIVER CIRCUIT

BACKGROUND OF THE INVENTION

1. Field of the Invention

The present invention, relates to a high-side driver circuit, more particularly to a high-side driver circuit combined with the bootstrap circuit and the depletion-mode transistor.

2. Description of the Prior Art

In the common high-efficiency and high-power system, the N-type device with better performance is used as the high-side power transistor. Thus, the source of the power transistor is a floating voltage, which is unable to be used to control the switch of the transistor directly via a constant gate voltage. The conventional method for solving the problem is that to adopt a bootstrap circuit to float the gate voltage with respect to the source voltage. The design for the high-side power transistor with the conventional bootstrap circuit is only applicable for the enhancement-mode transistor and is not the depletion-mode transistor, because the charging is not enough for the bootstrap capacitor upon driving the depletion-mode transistor.

Please referring to FIG. 1 which is a diagram illustrating the conventional high side gate driver with the bootstrap circuit. The bootstrap capacitor containing high side gate driver 100 is used to drive the enhancement-mode transistor Mtop. The operation principle is described as the followings: When the enhancement-mode transistor Mtop is turned off, the input voltage VCC will charge the first capacitor C1. In the first capacitor C1, the voltage of negative end (i.e. the source voltage of the enhancement-mode transistor Mtop) is zero, and the voltage of positive end is VCC. When the first transistor M1 is conducted, the gate-source voltage $V_{GS}$ of the enhancement-mode transistor Mtop is VCC. Thus, the enhancement-mode transistor Mtop is conducted, and the source voltage is increased to VDD. The gate-source voltage $V_{GS}$ of the enhancement-mode transistor Mtop is maintained at VCC via C1, in order to conduct the enhancement-mode transistor Mtop continuously. When the first transistor M1 is turned off, and the second transistor M2 is conducted, the gate-source voltage $V_{GS}$ of the enhancement-mode transistor Mtop is zero. Thus, the enhancement-mode transistor Mtop is turned off.

The design for this circuit is only applicable for the enhancement-mode transistor. When the power transistor is the depletion-mode transistor, the transistor is conducted because the gate-source voltage $V_{GS}$ of the depletion-mode transistor is zero. Thus, a circuit design applicable for the depletion-mode transistor is provided for the high side gate driver with the bootstrap circuit.

In recent years, many high performance power devices developed prosperously are the depletion-mode devices. One driver design of conventional depletion-mode transistor combines the MOSFET and high performance depletion-mode device to become the enhancement-mode device. Then, the driving technique of the existing enhancement-mode transistor is adopted to control the switch of device. However, this design will reduce the performance of the depletion-mode transistor, such as increase the on-resistance of composite device.

The second driver design of conventional depletion-mode transistor uses a floating voltage source to obtain the required negative voltage to control the switch of the depletion-mode transistor. However, this design requires a floating voltage source, which is more complicated.

The third driver design of conventional depletion-mode transistor uses the switch of a capacitor and relevant transistors to produce a negative voltage to control the switch of the depletion-mode transistor. However, this design is not applicable for the high-side driver circuit with the bootstrap circuit.

Therefore, the present invention provides a high side gate driver with the depletion-mode transistor. This circuit can combine the bootstrap circuit to complete the switch of the depletion-mode transistor without reducing the performance of the depletion-mode transistor and the need of a floating voltage source or a negative voltage source.

SUMMARY OF THE INVENTION

The present invention provides a high-side driver circuit including a power transistor, the first transistor, the second transistor, the second capacitor, the second diode, and the resistor. The drain of the power transistor couples with the first voltage source. The source of the first transistor is coupled between the first capacitor and the first diode. The second diode couples with the second voltage source. The drain of the second transistor couples with the drain of the first transistor. The second capacitor couples with the drain of the first transistor and the drain of the second transistor. The second diode couples with the second capacitor and the source of the second transistor. The second transistor couples with the output. The resistor is coupled between the second capacitor and the gate of the power transistor. The first level shifter couples with the first input and the second input.

The latch loop device couples with the first level shifter and the gate of the first transistor and the gate of the second transistor. The start-up circuit is coupled between the resistor and the second capacitor. The start-up circuit is used to turn off the power transistor, so that the second voltage source has enough time to charge the first capacitor.

The start-up circuit design of the high-side driver circuit further includes a third transistor and a second level shifter. The drain of the third transistor couples with the resistor. The gate and the source of the third transistor couple with the second level shifter. The source of the third transistor couples with the third voltage source. The third voltage source is a negative voltage source. The third transistor is conducted to produce a negative voltage at the gate of the power transistor. The third voltage source provides a negative voltage to the gate of the power transistor to turn off the power transistor, so that the second voltage source has enough time to charge the first capacitor.

The other start-up circuit design of the high-side driver circuit further includes a third transistor and a third diode. The source of the third transistor is grounded. The drain of the third transistor couples with the third diode. The third diode couples with the resistor and the second capacitor. The third diode limits the flow direction of a current to partially turn off the power transistor, so that the second voltage source has enough time to charge the first capacitor.

In another aspect, the power transistor is a depletion-mode transistor.

In another aspect, the material of the power transistor includes the silicon carbide (SiC) or the gallium nitride (GaN).

A high side gate driver with the depletion-mode transistor is provided to improve the problem of insufficient charging time for the bootstrap capacitor, in order to complete the switch of the depletion-mode transistor without reducing the performance of the depletion-mode transistor and the need of a floating voltage source or a negative voltage source.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to further understand the features and the technical contents of the present invention, please refer to the following detail description of invention and attached Figures. The attached Figures are only used for the reference and description, which are not used to limit the present invention.

Figure 1:
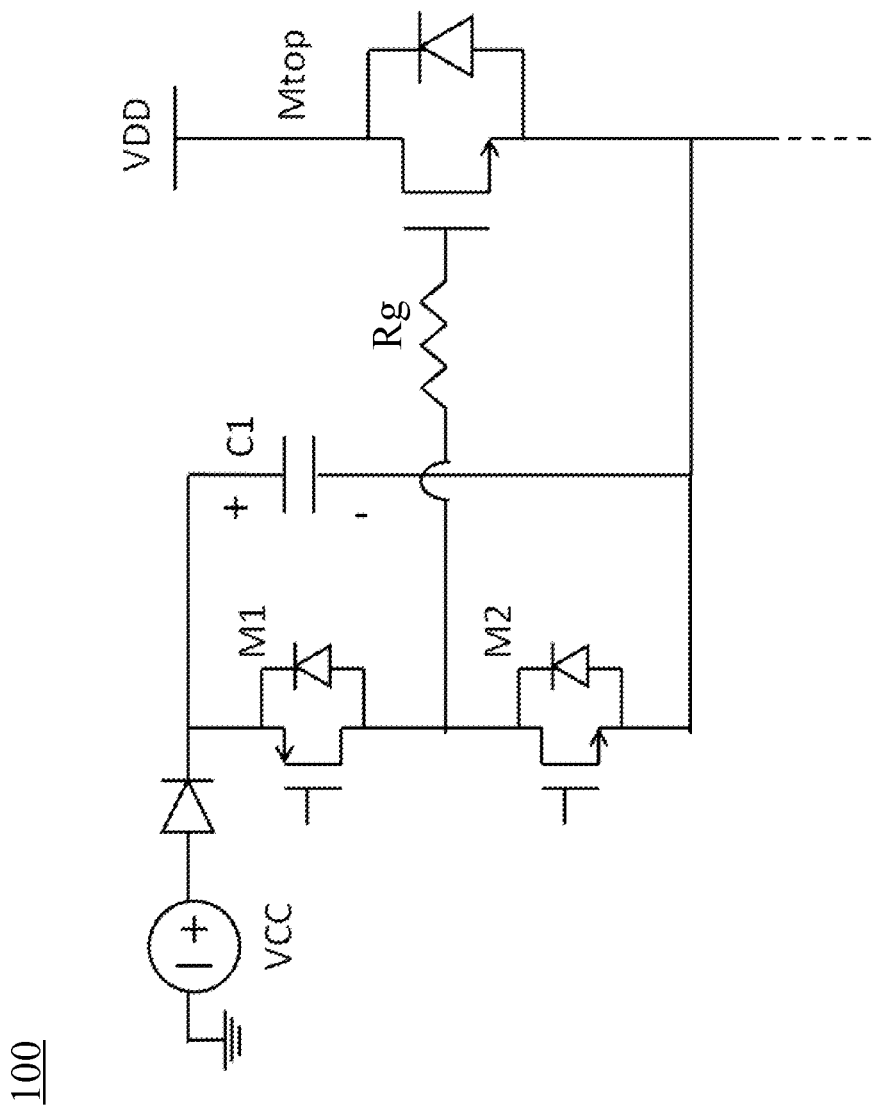
FIG. 1 is a diagram illustrating the conventional high side gate driver with the bootstrap circuit.
Figure 2:
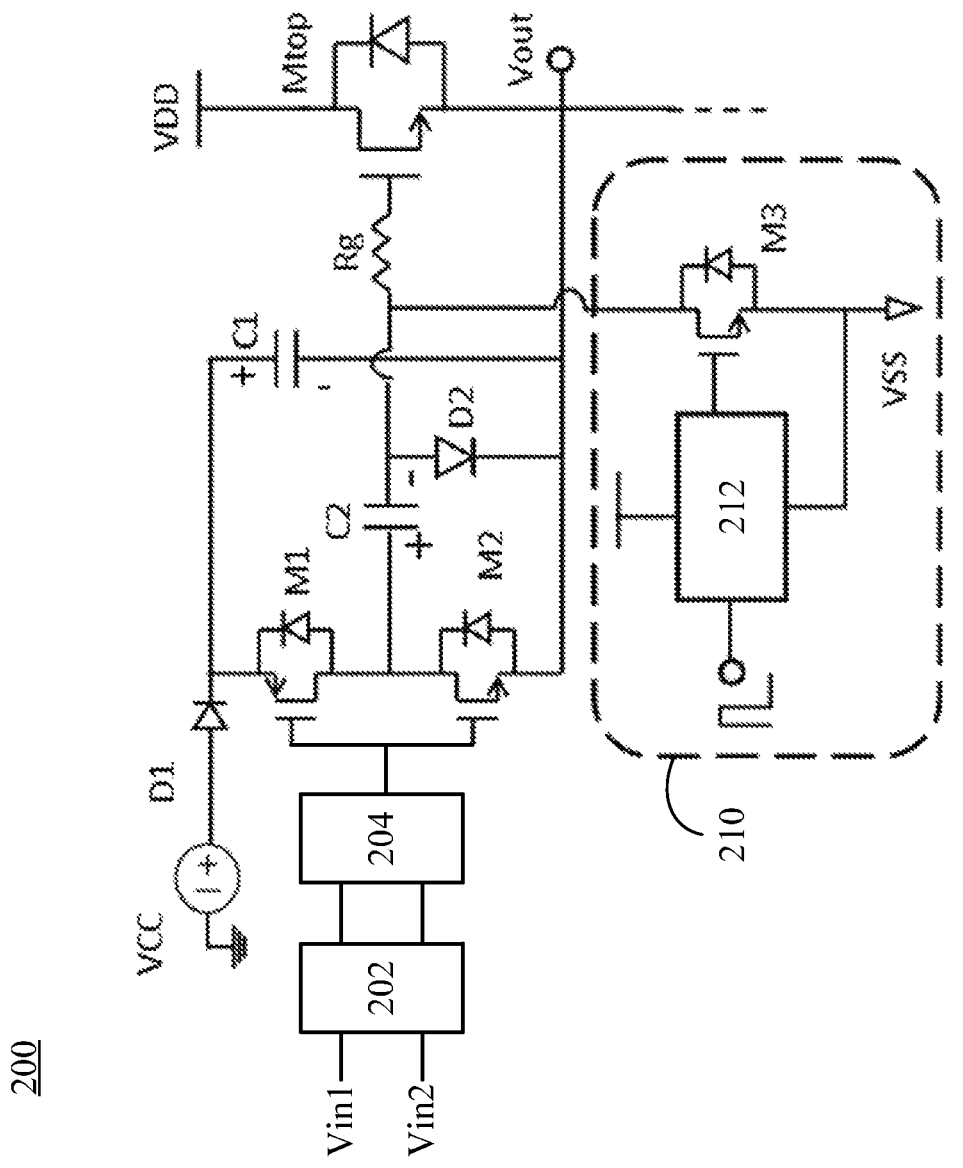
FIG. 2 is a diagram illustrating the high side gate driver with the depletion-mode transistor for an embodiment of the present invention.

Please referring to FIG. 2, which is a diagram illustrating the high side gate driver with the depletion-mode transistor for an embodiment of the present invention. The difference between the depletion-mode transistor and the enhancement-mode transistor is that when its gate-source voltage $V_{GS}$ is negative, the transistor is turned off, and when its gate-source voltage $V_{GS}$ is zero, the transistor is conducted. Thus, it is necessary to design a circuit to control the turn on/off of the depletion-mode transistor. As shown in FIG. 2, a high-side driver circuit 200 is disclosed. The high-side driver circuit 200 includes a power transistor Mtop, the first transistor M1, the second transistor M2, the first capacitor C1, the second capacitor C2, the first diode D1, the second diode D2, the start-up circuit 210, the first level shifter 202, the latch loop device 204 and the resistor Rg. The power transistor Mtop is a depletion-mode transistor. The resistor Rg can either be the gate resistance of the power transistor or an external resistor. The material of the power transistor Mtop includes the silicon carbide (SiC) or the gallium nitride (GaN). The drain of the power transistor Mtop couples with the first voltage source VDD. The source of the first transistor M1 is coupled between the first capacitor C1 and the first diode D1. The first diode D1 couples with the second voltage source VCC. The drain of the second transistor M2 couples with the drain of the first transistor M1. The second capacitor C2 couples with the drain of the first transistor M1 and the drain of the second transistor M2. The second diode D2 couples with the second capacitor C2 and the source of the second transistor M2. The second transistor M2 couples with the output Vout. In this embodiment, the output Vout is 0V to VDD. The resistor Rg is coupled between the second capacitor C2 and the gate of the power transistor Mtop. The first level shifter 202 couples with the first input Vin1 and the second input Vin2. The latch loop device 204 couples with the first level shifter 202 and the gate of the first transistor M1 and the gate of the second transistor M2. The start-up circuit 210 is coupled between the resistor Rg and the second capacitor C2. The start-up circuit is used to turn off the power transistor, so that the second voltage source has enough time to charge the first capacitor. In this embodiment, it is assumed that the capacitance of the first capacitor C1 is larger than the capacitance of the second capacitor C2 by above 10 times.

The start-up circuit 210 of the high-side driver circuit 200 shown in FIG. 2 is used to drive the depletion-mode power transistor Mtop. The start-up circuit 210 includes a second level shifter 212 and a third transistor M3. The drain of the third transistor M3 couples with the resistor Rg. The gate and the source of the third transistor M3 couple with the second level shifter. The third transistor M3 couples with the third voltage source VSS. The third voltage source VSS is a negative voltage source. When the third transistor M3 is conducted, the gate of the power transistor Mtop is negative voltage. The third voltage source VSS provide a negative voltage to the gate of the power transistor Mtop to turn off the power transistor Mtop. The second voltage source VCC charges the first capacitor C1. The voltage for the negative end of the first capacitor (i.e. the sourge voltage of the power transistor Mtop) is zero. Thus, the voltage for the positive end of the first capacitor C1 is VCC. When the first transistor M1 is conducted, the first capacitor C1, the second capacitor C2 and the second diode D2 form a loop. Thus, the The voltage difference of the second capacitor C2 is VCC. The voltage for the negative end of the second capacitor is zero. The gate-source voltage $V_{GS}$ of the power transistor Mtop is also zero, the power transistor Mtop is conducted. Similarly, the power transistor Mtop is conducted continuously through the bootstrap circuit. When the first transistor M1 is turned off and the second transistor M2 is conducted, the second diode D2 will be turned off by the voltage of the positive end of the second capacitor (i.e. the sourge voltage of the power transistor Mtop). The gate-source voltage $V_{GS}$ of the power transistor Mtop is −VCC, the power transistor Mtop is turned off. In this embodiment, the additional second capacitor C2, the second diode D2 and the start-up circuit 210 are used to control the depletion-mode power transistor Mtop. The second voltage source VCC will have enough time to charge the first capacitor C1 via the start-up circuit 210. In this embodiment, the high-side driver circuit 200 can complete the on/off of 24V depletion-mode power transistor Mtop, and the on/off frequency is 100 KHz.

Figure 3:
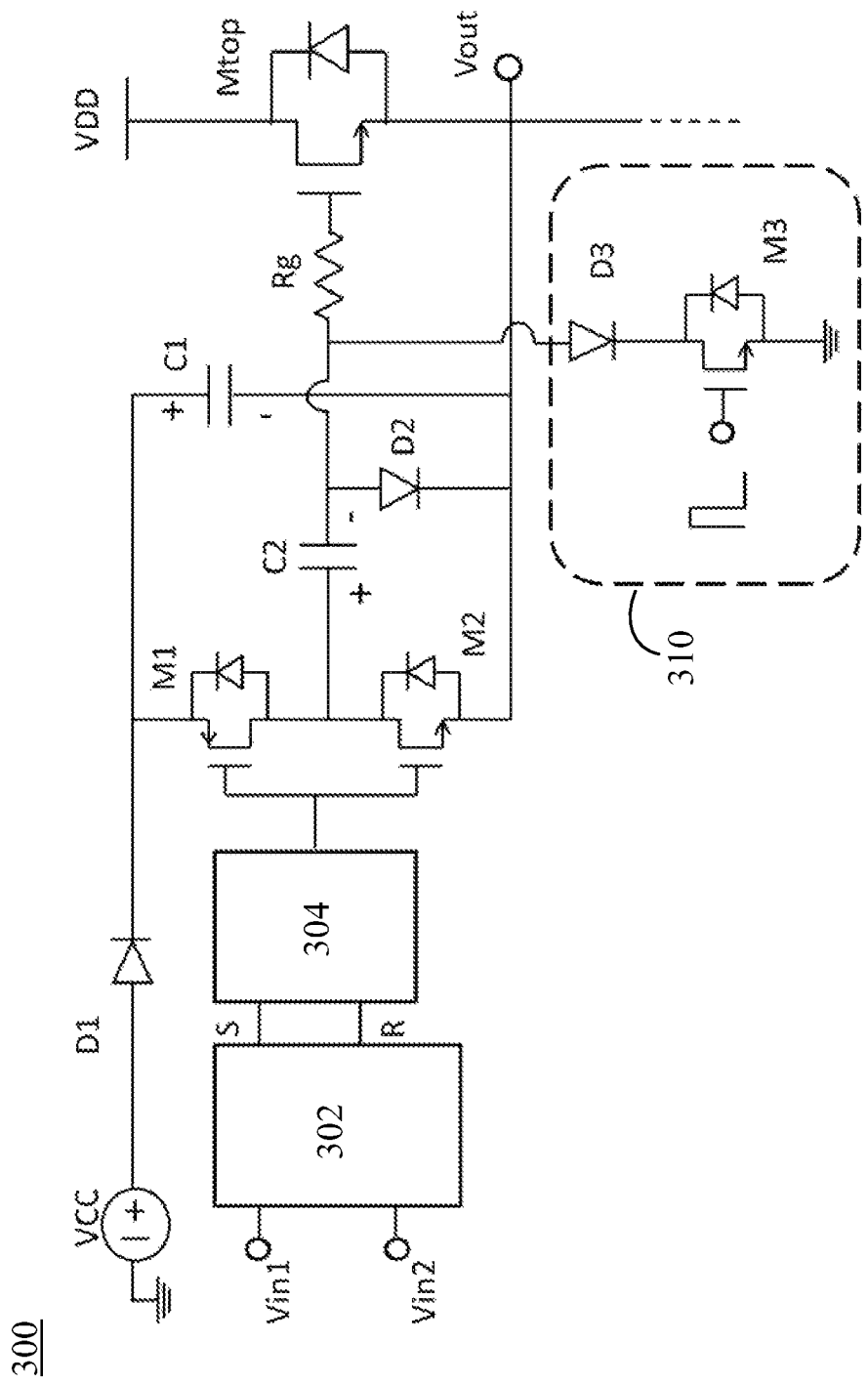
FIG. 3 is a diagram illustrating the high side gate driver with the depletion-mode transistor for another embodiment of the present invention.

Please referring to FIG. 3, which is a diagram illustrating the high side gate driver with the depletion-mode transistor for another embodiment of the present invention. The difference between this embodiment and the aforementioned embodiment is that the design of the start-up circuit 310 in this embodiment is different. The source of the third transistor M3 is grounded. The drain of the third transistor M3 is coupled with a third diode D3. The other end of the third diode D3 is coupled the resistor Rg and the second capacitor C2.

The high-side driver circuit 300 shown in FIG. 3 includes a power transistor Mtop, the first transistor M1, the second transistor M2, the first capacitor C1, the second capacitor C2, the first diode D1, the second diode D2, the third diode D3, the start-up circuit 310, the first level shifter 302, the latch loop device 304 and the resistor Rg. The power transistor Mtop is a depletion-mode transistor. The material of the power transistor Mtop includes the silicon carbide (SiC) or the gallium nitride (GaN). The drain of the power transistor Mtop couples with the first voltage source VDD. The source of the first transistor M1 is coupled between the first capacitor C1 and the first diode D1. The first diode couples with the second voltage source VCC. The drain of the second transistor M2 couples with the drain of the first transistor M1 and the drain of the second transistor M2. The second capacitor C2 couples with the drain of the first transistor M1 and the drain of the second transistor M2. The second diode D2 couples with the second capacitor C2 and the source of the second transistor M2. The second transistor M2 couples with the output Vout. The resistor Rg is coupled between the second capacitor C2 and the gate of the power transistor Mtop. The first level shifter 302 couples with the first input Vin1 and the second input Vin2. The latch loop device 304 couples with the first level shifter 302 and the gate of the first transistor M1 and the gate of the second transistor M2. The start-up circuit 310 is coupled between the resistor Rg and the second capacitor C2. In this embodiment, it is assumed that the capacitance of the first capacitor C1 is larger than the capacitance of the second capacitor C2 by above 10 times.

The start-up circuit 310 of the high-side driver circuit 300 shown in FIG. 3 is used to drive the depletion-mode power transistor Mtop. The start-up circuit 310 includes a third transistor M3 and a third diode D3. The drain of the third transistor M3 is grounded. The signal of 0-5V can be used directly to control the start-up circuit 310 without the need of additional level shifter.

Pleasing referring to FIG. 3 for the operation way. When the operation is started, the third transistor M3 of the start-up circuit 310 is conducted, the gate potential of the high-side power transistor Mtop is about 0V, the output Vout is limited to the critical voltage $V_{th}$ of the high-side power transistor. In this embodiment, if it is −4V, the output Vout will be about 4V. Then, the second voltage source VCC will charge the first capacitor C1, so that the span voltage of the first capacitor C1 will be VCC-Vout. The third transistor M3 is then turned off to control the switch of the high-side power transistor Mtop. In this embodiment, the additional second capacitor C2, the second diode D2 and the start-up circuit 310 are used to control the depletion-mode power transistor Mtop. The second voltage source VCC will have enough time to charge the first capacitor C1 via the start-up circuit 310.

It has to note that the first capacitor C1 can only be charged to VCC-Vout (i.e. approximate to VCC−$|V_{th}|$). Thus, a second voltage source VCC has to be selected to obtain −(VCC−$|V_{th}|$)<$V_{th}$ for turning off the power transistor Mtop. The third transistor M3 has a third diode D3 to limit the current flowing direction, in order to switch the power transistor Mtop normally.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled, in the art to which this invention pertains.

What is claimed is:

1. A high-side driver circuit, comprising:
   a power transistor, a drain of the power transistor coupling with a first voltage source;
   a first transistor, a source of the first transistor coupling between a first capacitor and a first diode, the second diode coupling with a second voltage source;
   a second transistor, a drain of the second transistor coupling with a drain of the first transistor;
   a second capacitor coupling with the drain of the first transistor and the drain of the second transistor;
   a second diode coupling with the second capacitor and the drain of the second transistor, wherein the second transistor coupling with an output;
   a resistor coupling between the second capacitor and a gate of the power transistor;
   a first level shifter coupling with a first input and a second input;
   a latch loop device coupling with the first level shifter and a gate of the first transistor and a gate of the second transistor; and
   a start-up circuit coupling between the resistor and the second capacitor;
   wherein the start-up circuit being used to turn off the power transistor, so that the second voltage source having enough time to charge the first capacitor.

2. The circuit according to claim 1, wherein the start-up circuit further comprises a third transistor and a second level shifter, the drain of the third transistor couples with the resistor, the gate and the source of the third transistor couple with the second level shifter, the source of the third transistor couples with the third voltage source.

3. The circuit according to claim 1, wherein the third voltage source is a negative voltage source, the third transistor is conducted to produce a negative voltage, the third voltage source provides a negative voltage to the gate of the power transistor to turn off the power transistor, so that the second voltage source has enough time to charge the first capacitor.

4. The circuit according to claim 1, wherein the start-up circuit further comprises a third transistor and a third diode, the source of the third transistor is grounded, the drain of the third transistor couples with the third diode, the third diode couples with the resistor and the second capacitor, the third diode limits a current to turn off the power transistor, so that the second voltage source having enough time to charge the first capacitor.

5. The circuit according to claim 1, wherein the power transistor is a depletion-mode transistor.

6. The circuit according to claim 5, wherein the material of the power transistor is selected from the group consisting of the silicon carbide (SiC) and the gallium nitride (GaN).

* * * * *